(12) United States Patent
Ho

(10) Patent No.: US 8,647,518 B2
(45) Date of Patent: Feb. 11, 2014

(54) RESIN COATED COPPER FOIL, METHOD FOR MANUFACTURING SAME AND MULTI-LAYER CIRCUIT BOARD

(71) Applicant: Zhen Ding Technology Co., Ltd., Taoyuan (TW)

(72) Inventor: Ming-Jaan Ho, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 0 days.

(21) Appl. No.: 13/757,857

(22) Filed: Feb. 4, 2013

(65) Prior Publication Data

US 2013/0284692 A1  Oct. 31, 2013

(30) Foreign Application Priority Data

Apr. 28, 2012  (CN) .......................... 2012 1 0128851

(51) Int. Cl.
  *H01B 13/00*  (2006.01)
(52) U.S. Cl.
  USPC .......................................................... 216/13

(58) Field of Classification Search
  USPC ....................................................... 216/13, 18
  See application file for complete search history.

(56) References Cited

U.S. PATENT DOCUMENTS

| | | | | |
|---|---|---|---|---|
| 3,850,773 A | * | 11/1974 | Lupinski et al. | 204/482 |
| 2007/0023874 A1 | * | 2/2007 | Kim et al. | 257/666 |

* cited by examiner

*Primary Examiner* — Roberts Culbert
(74) *Attorney, Agent, or Firm* — Altis Law Group, Inc.

(57) ABSTRACT

A method for manufacturing a resin coating on copper foil includes following steps. Firstly, two diamines of 2,2-bis[4-(4-aminophenoxy)phenyl] propane and 4,4'-oxydianiline, and two acid anhydrides of pyromellitic diandydride and oxydiphthalic anhydride are added into a polar aprotic solvent and the solvent is stirred to form a mixed solution. Secondly, the mixed solution is heated to a temperature of about 170° C.-190° C. to allow a cross-linking reaction to be completed between the two diamines and the two acid anhydrides, thereby forming a thermoplastic polyimide adhesive fluid. The thermoplastic polyimide adhesive fluid is coated on a copper foil and cured to form a thermoplastic polyimide adhesive layer on the copper foil, thereby obtaining a resin coated copper foil. This disclosure also relates to resin coated copper foil and a method for manufacturing a multi-layer circuit board.

12 Claims, 5 Drawing Sheets

RESIN COATED COPPER FOIL, METHOD FOR MANUFACTURING SAME AND MULTI-LAYER CIRCUIT BOARD

BACKGROUND

1. Technical Field

The present disclosure relates to coatings on copper foil, a method for manufacturing the same and a multi-layer circuit board using a resin coated copper foil.

2. Description of Related Art

A multi-layer circuit board includes a plurality of electrically conductive layers and insulation layers arranged between the electrically conductive layers. Generally, a material of the insulation layers is polyimide (PI). The insulation layers are bonded to the electrically conductive layers via adhesive such as epoxy resin or acrylic resin. However, the adhesive layers have weaker heat resistance, weaker insulation and weaker flexibility than insulation layer made of PI. Thus, the electrical and physical properties of the multi-layer circuit board are less than optimal.

What is needed therefore is a resin coated copper foil, a method for manufacturing the same and a multi-layer circuit board using the resin coated copper foil to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
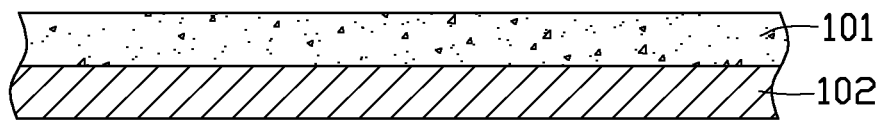
FIG. 1 is a cross-sectional view of a resin coated copper foil in accordance with a first exemplary embodiment.

Various embodiments will be described with reference to the drawings.

A method for manufacturing a resin coated copper foil in accordance with a first exemplary embodiment is provided. The method includes the following steps.

Step (1): Two diamines are added into a solvent to form a first mixture. The first mixture is stirred until the diamines are fully dissolved, forming a first mixed solution. Two acid anhydrides are added into the first mixed solution, forming a second mixture. The second mixture is stirred until the two acid anhydrides are also fully dissolved, thereby forming a second mixed solution.

The diamines are 2,2-bis[4-(4-aminophenoxy)phenyl]propan (BAPP), and 4,4'-oxydianiline (ODA). The acid anhydrides are pyromellitic diandydride (PMDA), and oxydiphthalic anhydride (ODPA). The solvent is a polar aprotic solvent. In this embodiment, the solvent is N,N-dimethylacetamide (DMAC). In this embodiment, the amounts by weight of the diamines, the acid anhydrides and the solvent in the second mixed solution are shown in Form I as follows:

| Form I: weight percents of materials | |
|---|---|
| Materials | Percent by Weight (wt %) |
| BAPP | 1.2% to 1.3% |
| ODA | 7.8% to 8.0% |
| PMDA | 1.3% to 1.5% |
| ODPA | 5.9% to 6.1% |
| DMAC | 83.1% to 83.8% |
| sum | 100% |

In alternative embodiments, the solvent can also be selected from at least one of N-methylpyrrolidinone (NMP) and dimethyl sulfoxide (DMSO).

In this embodiment, the first mixture is stirred for a time period of from 40 minutes to 80 minutes, at a room temperature or at a temperature of about 50° C. The second mixture is stirred for a time period of from 5 hour and 40 minutes to 6 hours and 20 minutes within the same range of temperatures.

Step (2): The second mixed solution is heated and stirred to cause a cross-linking reaction between the two diamines and the two acid anhydrides, thereby forming a PI adhesive fluid.

In this embodiment, a xylene is added into the second mixed solution, and the second mixed solution is heated to a temperature in the range from 170° C. to 190° C. and stirred for a time period of from 5 hours and 40 minutes to 6 hours and 20 mins. The cross-linking reaction between the two diamines and the two acid anhydrides generates a PI adhesive fluid and water. The heating and stirring during the reaction causes constant volatilization of the water and the xylene out of the second mixed solution. The xylene carries the water out of the second mixed solution to promote fast volatilization of the water, and is not involved in the cross-linking reaction. Preferably, an amount by weight of the xylene in the second mixed solution is in the range from 3% to 8%. The PI adhesive fluid has properties as shown in Form II as follows:

| Item | Properties | Instruction/Comments |
|---|---|---|
| Appearance | golden color | |
| Viscosity | 30,000~50,000 cps | Viscometer: Brookfield DV-E Test conditions: 10 rpm, 25° C. |
| Non-volatile component | 16~20 wt % | |
| Thixotropy factor | 1.6~2.3 | Test condition: 1 rpm/10 rpm |

Step (3): the PI adhesive fluid is applied over a copper foil 102, and the PI adhesive is pre-cured to form a PI adhesive, thereby forming a copper foil coated with resin (resin coated copper foil 10). The resin coated copper foil 10 includes a copper foil 102 and a thermoplastic PI layer 101 comprised of the PI adhesive on a surface of the copper foil 102. The method for forming the resin coated copper foil 10 is described as follows:

During the cross-linking reaction in a previous step, a plurality of bubbles are generated in the PI adhesive fluid. At first, the PI adhesive fluid is de-aerated for about 24 hours or for less than 24 hours in a vacuum machine to expel the bubbles out of the PI adhesive fluid. Then, as FIG. 1 shows, a copper foil 102 and the PI adhesive fluid applied over a surface of the copper foil 102 is achieved. Finally the copper foil 102 coated by the PI adhesive fluid is heated to a temperature in the range of from 110° C. to 130° C. for a time period in the range of from 20 minutes to 1 hour to volatilize the solvent DMAC in the PI adhesive fluid and pre-cure the PI adhesive fluid, hereby forming a tough and flexible resin coated copper foil 10 comprising the copper foil 102 and a thermoplastic PI layer 101 formed on a surface of the copper foil 102. The thermoplastic PI layer 101 has a property of being viscid and tacky and is then re-cured by heating to a temperature in the range of from 220° C. to 240° C.

In this embodiment, the thermoplastic PI layer 101 has heat-resistant property, and provides significantly better insulation and flexibility than the traditional adhesive layer. In addition, the thermoplastic PI layer 101 can replace the twin layers of the traditional PI layer and the adhesive layer, thus the resin coated copper foil 10 has a smaller thickness.

Figure 2:
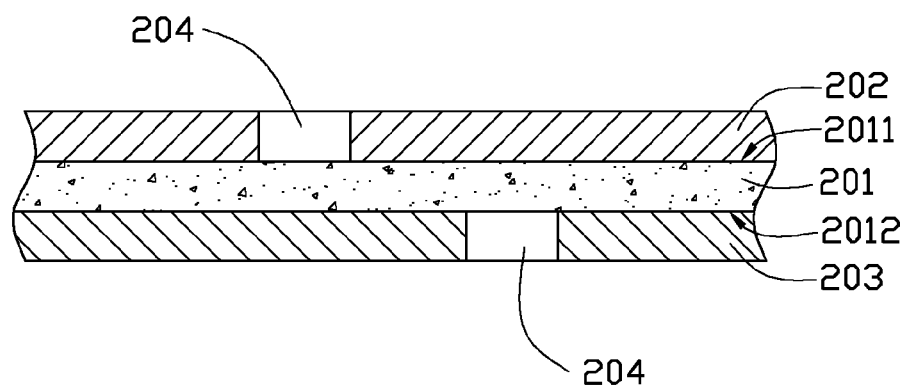
FIG. 2 is a cross-sectional view of a core substrate in accordance with a second exemplary embodiment, the core substrate comprising a thermoplastic PI layer, a first electrically conductive layer and a second electrically conductive layer on opposite surfaces of the thermoplastic PI layer, and each of the first and second electrically conductive layers defining at least one opening exposing the thermoplastic PI layer.

FIGS. 2-5 show a method for manufacturing a multi-layer circuit board in accordance with a second exemplary embodiment. The method includes the following steps:

Firstly: FIG. 2 shows a core substrate 20. The core substrate 20 includes an insulation layer 201 with a PI material, a first patterned electrically conductive layer 202 and a second patterned electrically conductive layer 203. The insulation layer 201 has a first surface 2011 and an opposite second surface 2012. The first patterned electrically conductive layer 202 is arranged on the first surface 2011, and the second patterned electrically conductive layer 203 is arranged on the second surface 2012. Each of the first patterned electrically conductive layer 202 and the second patterned electrically conductive layer 203 has at least one opening 204 exposing the insulation layer 201.

Figure 3:
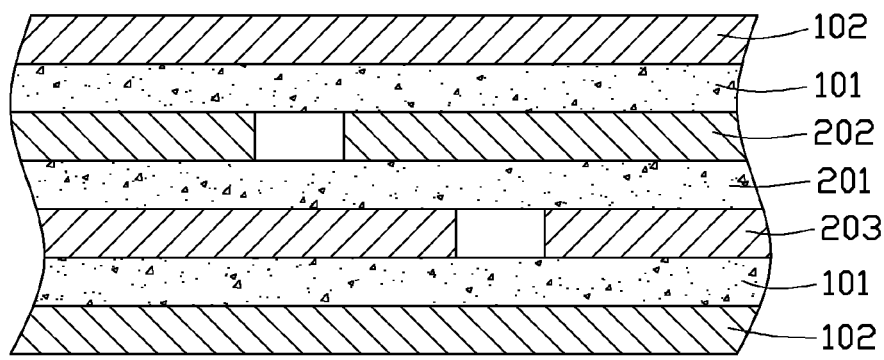
FIG. 3 is a cross-sectional view of a multi-layer structure formed by stacking a resin coated copper foil on each of two opposite sides of the core substrate.
Figure 4:
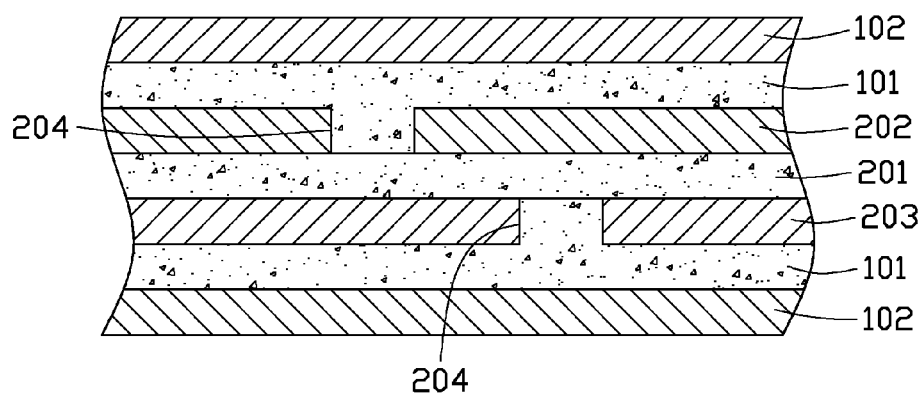
FIG. 4 is similar to FIG. 3, but showing the opening defined in the first and second electrically conductive layer filled with thermoplastic PI materials, by pressing the multi-layer structure from two opposite sides thereof.

Secondly: FIG. 3 shows two resin coated copper foils 10 respectively stacked on the first patterned electrically conductive layer 202 and on the second patterned electrically conductive layer 203. The first patterned electrically conductive layer 202, the core substrate 20 and the second patterned electrically conductive layer 203 form a preformed multi-layer board 30. The thermoplastic PI layers 101 of the resin coated copper foils 10 are respectively arranged adjacent to the first patterned electrically conductive layer 202 and the second patterned electrically conductive layer 203.

Thirdly, the preformed multi-layer board 30 is compressed together from opposite sides. Conditions of pressing the preformed multi-layer board 30 are: intensity of pressure is 3 MPa, an ambient temperature of from 210° C. to 240° C., and a pressing time of from 2 hours to 2.5 hours.

When applying compression, materials of the thermoplastic layer 101 flow into the opening 204 in the first patterned electrically conductive layer 202 and in the second patterned electrically conductive layer 203, and are cured due to the heat as well as the pressure. Thus all layers of the preformed multi-layer board 30 become firmly combined together.

Figure 5:
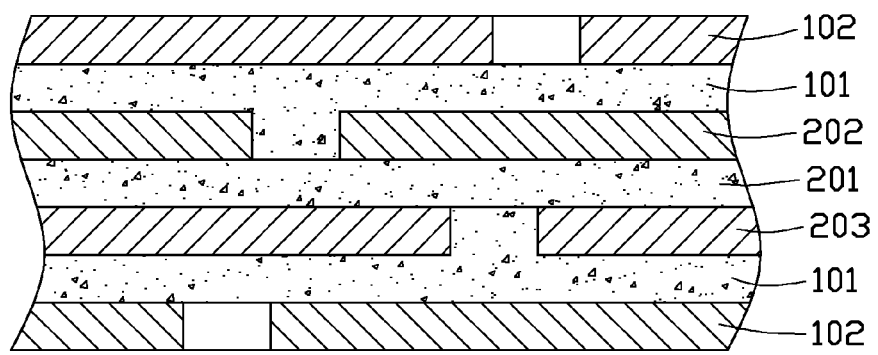
FIG. 5 is similar to FIG. 4, but showing the resin coated copper foil being selectively removed to form a third electrically conductive layer and a fourth electrically conductive layer, thereby obtaining a multi-layer circuit board.

Finally: FIG. 5 shows that the copper layers 102 (or a portion) of the resin coated copper foil 10 are etched to be converted into a third patterned electrically conductive layer 501 and a fourth patterned electrically conductive layer 502. Thus, a multi-layer circuit board 50 comprising four patterned electrically conductive layers is obtained.

The multi-layer circuit board 50 includes an insulation layer 201, a first patterned electrically conductive layer 202, a second patterned electrically conductive layer 203, two thermoplastic PI layers 101, a third patterned electrically conductive layer 501 and a fourth patterned electrically conductive layer 502. The insulation layer 201 has a first surface 2011 and an opposite second surface 2012. The first patterned electrically conductive layer 202 is arranged on the first surface 2011, and the second patterned electrically conductive layer 203 is arranged on the second surface 2012. One thermoplastic PI layer 101 and the third patterned electrically conductive layer 501 are sequentially stacked on the first surface 2011, and the other thermoplastic PI layer 102 and the fourth patterned electrically conductive layer 502 are sequentially stacked on the second surface 2012.

In alternative embodiments, the fourth patterned electrically conductive layer 502 and the thermoplastic PI layer 101 adjacent to the same can be omitted, or the multi-layer circuit board 50 can include further thermoplastic PI layers 101 and patterned electrically conductive layers.

While certain embodiments have been described and exemplified above, various other embodiments from the foregoing disclosure will be apparent to those skilled in the art. The present disclosure is not limited to the particular embodiments described and exemplified, but is capable of considerable variation and modification without departure from the scope and spirit of the appended claims.

The invention claimed is:

1. A method for manufacturing a resin coated copper foil, comprising:
    adding diamines of 2,2-bis[4-(4-aminophenoxy)phenyl] propane and 4,4'-oxydianiline into a polar aprotic solvent, and adding acid anhydrides of pyromellitic diandydride and oxydiphthalic anhydride into the polar aprotic solvent to form a mixture, and stirring the mixture to form a second mixed solution;
    heating the second mixed solution to a temperature of 170° C. to 190° C. to cause a cross-linking reaction between the diamines and the acid anhydrides, thereby forming a thermoplastic polyimide adhesive fluid; and
    applying the thermoplastic polyimide adhesive fluid over a copper foil, and pre-curing the thermoplastic polyimide adhesive fluid to form a thermoplastic polyimide adhesive layer over the copper foil, thereby obtaining a resin coated copper foil.

2. The method of claim 1, wherein the step of adding the diamines of 2,2-bis[4-(4-aminophenoxy)phenyl] propane and 4,4'-oxydianiline into a polar aprotic solvent, and adding acid anhydrides of pyromellitic diandydride and oxydiphthalic anhydride into the polar aprotic solvent to form a mixture comprises:
    adding the diamines of 2,2-bis[4-(4-aminophenoxy)phenyl] propane and 4,4'-oxydianiline into the polar aprotic solvent to form a first mixture, and stirring the first mixture for a time period of from 40 minutes to 80 minutes at a room temperature to form a first mixed solution; and
    adding the acid anhydrides of pyromellitic diandydride and oxydiphthalic anhydride into the first mixed solution to form a second mixture, and stirring the second mixture for a time period of 5 hours and 40 minutes to 6 hours and 20 minutes at a room temperature to form the second mixed solution.

3. The method of claim 1, wherein an amount by weight of the pyromellitic diandydride in the second mixed solution is in the range from 1.3% to 1.5%, and an amount by weight of the oxydiphthalic anhydride in the second mixed solution is in the range from 5.9% to 6.1%.

4. The method of claim 3, wherein an amount by weight of the 2,2-bis[4-(4-aminophenoxy)phenyl] propane in the second mixed solution is in the range from 1.2% to 1.3%, and an amount of the 4,4'-oxydianiline in the second mixed solution is in the range from 7.8% to 8.0%.

5. The method of claim 4, wherein the polar aprotic solvent is N,N-dimethylacetamide, and an amount by weight of the N,N-dimethylacetamide in the second mixed solution is in the range from 83.1% to 83.8%.

6. The method of claim 1, further comprising adding xylene to the second mixed solution, an amount by weight of the xylene in the second mixed solution is in the range from 3% to 8%, the xylene being added to the second mixed solution after forming the second mixed solution and before heating the second mixed solution.

7. The method of claim 1, wherein the thermoplastic polyimide adhesive fluid is heated at a temperature of 110° C. to 130° C. for 20 minutes to 60 minutes.

8. The method of claim 1, wherein the thermoplastic polyimide adhesive fluid is deaerated for about 24 hours or less than 24 hours in a vacuum machine to expel bubbles out of the polyimide adhesive fluid prior to applying the thermoplastic polyimide adhesive fluid over the copper foil.

9. A resin coated copper foil, comprising a copper foil and a thermoplastic polyimide layer formed on the copper foil, the resin coated copper foil being formed using the method of claim 1.

10. A method for manufacturing a multi-layer circuit board, comprising:
providing a core substrate, the core substrate comprising a first patterned electrically conductive layer, an insulation layer and a second patterned electrically conductive layer, the first and second patterned electrically conductive layers being arranged on opposite surfaces of the insulation layer;
stacking two resin coated copper foils of claim 9 respectively on the first and second patterned electrically conductive layers to form a preformed multi-layer board, the thermoplastic polyimide layers of the resin coated copper foils being respectively arranged adjacent to the first and second patterned electrically conductive layers;
heating and compressing the preformed multi-layer board to cure the thermoplastic polyimide layers; and
etching the copper foils of the resin coated copper foils to convert the copper foils into a third patterned electrically conductive layer and a fourth patterned electrically conductive layer, thereby obtaining a multi-layer circuit board.

11. The method of claim 10, wherein a temperature for heating the multi-layer board is in the range from 220° C. to 240° C.

12. The method of claim 11, wherein a pressure of pressing the multi-layer board is about 3 MPa, and a time period of heating and pressing the multi-layer board is in the range from 2 hours to 2.5 hours.

* * * * *